AUDIO LIMITER CIRCUITS

Filed Dec. 15, 1948 2 SHEETS—SHEET 1

INVENTOR
LAWRENCE C. FULLER, JR.
BY Harry Tunick
ATTORNEY

INVENTOR
LAWRENCE C. FULLER, JR.
BY Harry Tunick
ATTORNEY

Patented Sept. 9, 1952 2,610,252

UNITED STATES PATENT OFFICE 2,610,252

AUDIO LIMITER CIRCUITS

Lawrence Campbell Fuller, Jr., Ardmore, Pa., assignor to Radio Corporation of America, a corporation of Delaware Application December 15, 1948, Serial No. 65,378

18 Claims. (Cl. 179—1)

The invention relates to circuit arrangements for producing electric waves in response to desired acoustic waves, and it particularly pertains to carbon microphone input circuits for audio frequency amplifiers and especially those employed in modulation stages of radio transmitters.

Although the basic concept of limiting the amplitude of an audio frequency electrical wave, useful for example in preventing overmodulation of a modulated R. F. carrier wave, by means of circuits limiting the level of the input voltage derived from an acoustical conversion device, or microphone, is old, the known methods and circuit arrangements for carrying out the process contribute considerable distortion to the resultant modulated output carrier wave. Furthermore, the known arrangements are relatively complex and are prone to allow microphonic disturbances to be set up due to the complexity of the circuits. To overcome the latter disadvantage, even more complex circuitry has been suggested, which of course entails considerable expense in construction.

It is an object of the invention to provide an audio frequency input circuit having means to limit the amplitude of the output wave.

It is another object of the invention to provide a circuit arrangement preventing overmodulation of the carrier wave by maintaining a constant audio input volume level to the modulating circuit of a radio transmitter.

It is a further object of the invention to provide a circuit arrangement for limiting the output amplitude of an acoustical electrical conversion device while utilizing an input volume varying over a wide range of intensities.

It is still another object of the invention to provide a modulation circuit arrangement contributing negligible distortion to the resultant modulated carrier wave.

It is yet a further object of the invention to provide a circuit arrangement preventing overmodulation of the carrier wave while permitting the utilization of an acoustical input volume varying over a wide range of intensities.

It is a still further object of the invention to provide a non-microphonic circuit arrangement for compressing the audio input to a radio transmitter.

It is yet another object of the invention to provide a simple and inexpensive audio frequency input circuit to the modulator of a radio transmitter.

These and further objects of the invention will appear as the specification progresses.

In accordance with the invention there is provided a circuit arrangement for coupling a carbon microphone to the amplifying stages of a utility device, for example a public address system or the modulation circuits of a radio transmitter, which circuit arrangement has incorporated therein means to prevent overmodulation of the output wave by maintaining a constant audio input volume level to the circuits even though the acoustical input volume level may be varying over a wide range.

The invention will be described with reference to the accompanying drawing forming a part of the specification and in which.

While the basic principles of the carbon microphone are well known to the artisan, a concise explanation of the operation of the same will not be amiss at this point inasmuch as the invention is based thereon. Carbon microphones usually comprise one or two members, termed "buttons" by those familiar with the art, having small carbon granules lightly held therein so that they may be compressed and released by actuation of acoustical waves impinging on a collector which is usually provided in the form of a flat mechanical diaphragm. Each button is connected in series with a source of direct potential and an output device which, in nearly every practical case, is a voltage step-up transformer. As the acoustical waves effect compression and release of the carbon granules, the direct current resistance thereof is changed appreciably. Since the current remains substantially constant, the potential across the button varies proportionally in accordance with ohms law to produce an electric wave of audio frequency which is applied to any desired utilization circuit.

Figure 1:
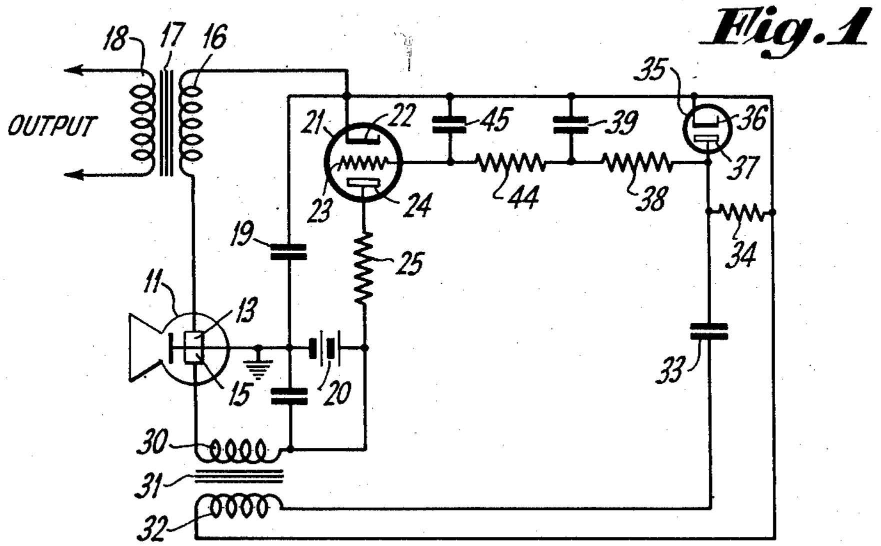
Fig. 1 is a schematic diagram of a circuit arrangement according to the invention.
Figure 2:
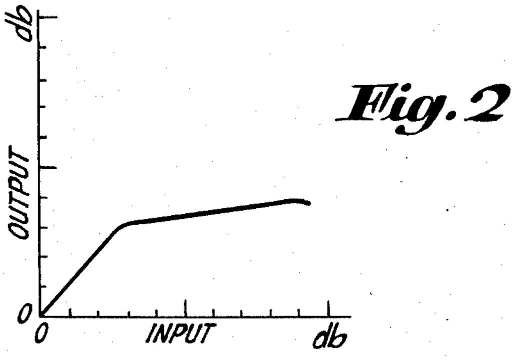
Fig. 2 is a graphical representation of the performance of the circuit arrangement illustrated in Fig. 1.

Referring now to Fig. 1, there is shown a circuit arrangement of an embodiment of the invention wherein a double-button carbon microphone 11 is utilized to produce an audio frequency voltage proportional to the acoustical wave impinging on the diaphragm which may be applied to the modulating circuit of a radio transmitter or to the subsequent stages of a public address amplifier in known manner and a second alternating voltage, also of audio frequency, which is utilized according to the invention as a control of the amplitude level of the first voltage. The above mentioned audio frequency voltage is developed by actuation of the diaphragm on button 13 which is connected in series with the input winding 16 of a microphone input transformer 17 and a capacitor 19 to complete the A. C. path. From a source of direct potential, shown here as a battery 20, a direct current is made to flow through microphone button 13 and winding 16 through the intermediary of an electron discharge tube 21 and a current limiting resistor 25. If the direct current is substantially constant an audio frequency voltage proportional to the acoustic energy incident to the microphone will appear across the microphone terminals. If, however, the direct current in this circuit is varied proportionally to the amplitude level of the derived audio frequency voltage the amplitude level can be maintained at any desired proportionate value. The present embodiment of the invention contemplates maintaining the audio frequency voltage level constant by varying the direct current inversely proportional to the amplitude level of the derived voltage by varying the resistance component existing between the cathode 22 and the anode 24 of tube 21. This is accomplished in an actual circuit by connecting the remaining button 15 in series with the source of direct potential, shown here as battery 20, and the primary winding 30 of a transformer 31. The audio frequency voltage induced in the secondary winding 32 of transformer 31 is applied via a coupling capacitor 33 to a load resistor 34. A direct potential proportional to the alternating voltage is obtained by means of a diode rectifier 35 connected across resistor 34 and is applied via a resistor 38 connected to anode 37 to a capacitor 39, whose remaining terminal is connected to cathode 36 of diode 35 and cathode 22 of triode 21. The direct potential appearing on capacitor 39 is applied through the intermediary of a decoupling network comprising a resistor 44 and a capacitor 45, eliminating to an adequate extent any alternating voltage on control grid 23 of triode 21. The direct potential applied to the grid 23 of tube 21 determines the current passing through the tube, which is the same current that flows through microphone button 13. Since there is provided a means of making the microphone current diminish as the input signal increases and vice versa, the action tends to make the output level remain constant regardless of wide variations in the input level. Any microphonics will be effectively filtered out by capacitor 19. Since the electrical wave derived in response to the acoustic wave impressed on the diaphragm of microphone 11 is confined to a circuit comprising the primary 16 of transformer 17 and capacitor 19, any distortion or microphonics must originate in capacitor 19, transformer 17, or button 13 of microphone 11. If capacitor 19 is made sufficiently large, it is very unlikely that it will contribute any distortion and it cannot possibly contribute any microphonics. Transformer 17 likewise cannot contribute microphonics and the distortion contributed may be made as low as is consistent with the size and cost of the transformer. Microphone 11 is then the only appreciable source of noise and distortion and by careful selection and construction thereof distortion from this source can be held to negligible value. The audio frequency voltage derived across secondary winding 18 of transformer 17 may be applied directly to the modulation tube of the radio transmitter without further amplification thus eliminating the possibility of any microphonics or distortion from that source.

Figure 3:
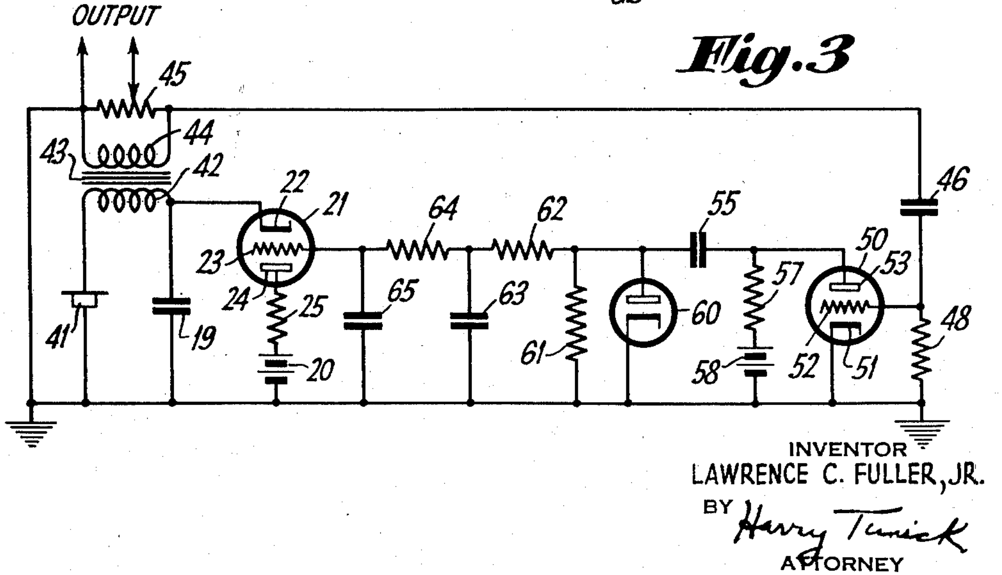
Fig. 3 is a schematic diagram of a preferred embodiment of the invention.

Referring to Fig. 3 there is shown a circuit arrangement of the preferred embodiment of the invention wherein a single-button carbon microphone 41 is connected in series to the primary winding 42 of a microphone input transformer 43 and a capacitor 19 to form the A. C. path similar to that for Fig. 1. The audio frequency voltage appearing in the circuit will traverse the primary winding 42 of transformer 43 inducing an audio frequency voltage across the secondary winding 44 in proportion to the turns ratio of the transformer. From the high side of winding 44 a coupling capacitor 46 and a coupling resistor 48 apply the audio frequency voltage to the control grid 52 of an amplifier tube 50. The audio frequency voltage is amplified by tube 50 and the amplified voltage appears across a load resistor 57. By means of a coupling capacitor 55 the amplified audio voltage is applied to a diode rectifier 60 and diode load resistor 61. A resistor 62 and a capacitor 63 are connected in series across load resistor 61, a negative voltage appears across capacitor 63 and is transferred by way of a decoupling resistor 64 and a decoupling capacitor 65 to the grid electrode 23 of limiter tube 21. The decoupling network comprising resistor 64 and 65 prevent, to an adequate extent, any alternating voltage from reaching the grid 23 of tube 21. The direct voltage applied to the grid of tube 21 determines the current passing through the tube, which is the same current flowing through microphone 41. Since there is provided a means of making the microphone current diminish as the input signal increases and vice versa, this action tends to maintain the output level constant regardless of the input level. Any wave of microphonic origin will be effectively filtered out by capacitor 19. Since the electric wave derived in response to the acoustic wave impressed on the diaphragm of microphone 41 is confined to a circuit comprising the primary 42 of transformer 43 and capacitor 19 any distortion or microphonics must originate in capacitor 19, transformer 43 or microphone 41. As previously stated a sufficiently large capacitor 19, together with carefully selected and constructed transformer 43 and microphone 41, serve to hold distortion from this source to negligible value. The audio frequency voltage derived across secondary winding 44 of transformer 43 may be applied directly to the modulation stage of the radio transmitter without further amplification thus eliminating the possibility of any microphonics or distortion arising in subsequent amplifier stages. As shown in Fig. 3, a potentiometer 45 is preferably interposed in the output of the circuit to provide a means of adjusting the modulation level of the transmitter or the volume level of an amplifier.

Figure 4:
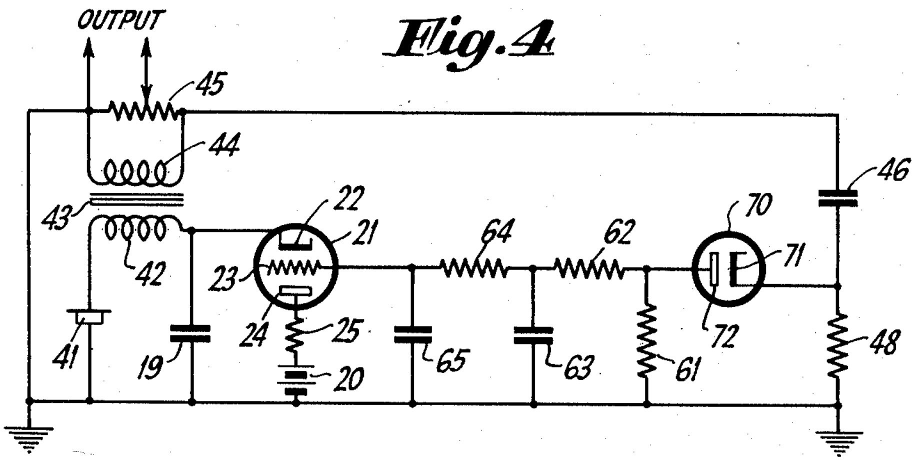
Figs. 4 and 5 are schematic diagrams of alternate arrangements of the preferred embodiment of the invention shown in Fig. 3.

Referring to Fig. 4, there is shown a simplified version of the arrangement shown in Fig. 3 which may be employed if the gain afforded by the components used is sufficient. Where the components of Fig. 4 correspond to those shown in Fig. 3 the same reference numerals have been employed. In this arrangement the amplifier stage has been eliminated and the control voltage developed across resistor 48 is rectified by means of a diode 70, having its cathode 71 connected to the junction of capacitor 46 and resistor 48, and applied to the input of the filter by means of a connection from the anode 72 to the junction of resistors 61 and 62. Any form of rectifier may be used such as a crystal or copper oxide rectifier if desired. Also the physical size of the arrangement may be reduced by employing a diode-triode type tube for control tube 21 and diode 70, or a twin triode tube may be used with the control grid of the section serving as a diode connected directly to the anode thereof.

Figure 5:
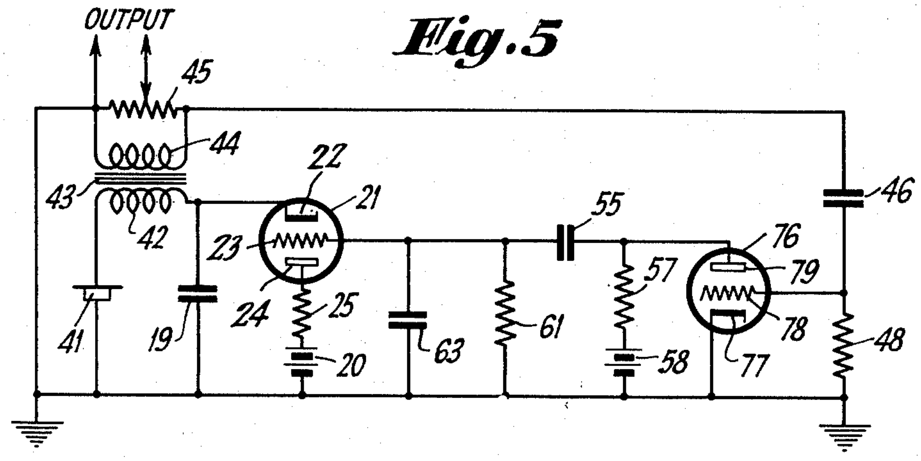
Figure 6:
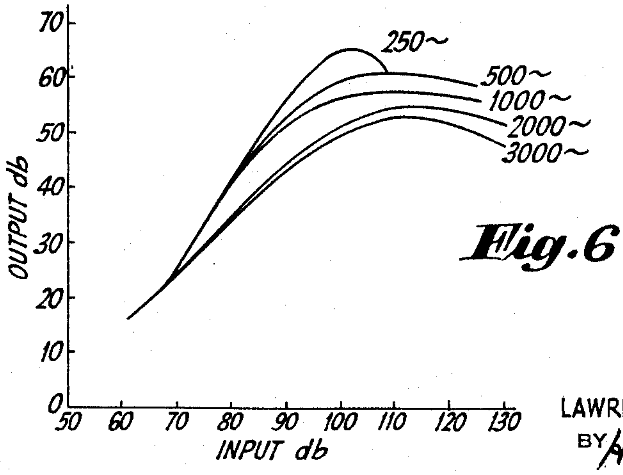
Fig. 6 is a graphical representation of the operation of the circuit arrangement shown in Fig. 3.

Referring to Fig. 5 there is suggested another modification of the circuit of Fig. 3 in which the filter circuit is reduced to a shunt connected section comprising a resistor 61 and a capacitor 63 and a triode vacuum tube 21 is connected so that its grid 23 acts as the anode of a diode rectifier section with cathode 22 and also as the input grid of a D. C. amplifier section with cathode 22 and anode 24. Vacuum tube 76 is an audio amplifier operating in the same fashion as that of vacuum tube 50 in the arrangement of Fig. 3.

It should be noted that in the arrangements shown, coupling capacitor 46 (33 in Fig. 1) and resistor 48 (34 in Fig. 1) may be given values to provide a pre-emphasis characteristic. This characteristic is especially important for application of the invention to phase modulation transmitter circuits where it has been found desirable to limit the higher audio frequencies sooner than the lower audio frequencies at an ideal rate of 6 db per octave. With the circuits shown, a satisfactory rate of 3 db per octave can be readily obtained. The circuit arrangements shown are obviously advantageous for use with public address systems, in which systems the pre-emphasis characteristic is often also desirable.

It is also contemplated that the principles of the invention may be put into use with electrical devices requiring the smallest of available components, such as hearing-aid devices, radio transmitters of the so-called "handy-talky" type, and the like, and incorporating either miniature electron discharge devices or multi-electrode crystal devices such as transistors, or combinations of these devices, with results equal to those obtained with components expressly described. It is believed that the advantages incurred by the use of the invention as applied to hearing-aids are too obvious to discuss in detail.

While the invention has been described with reference to several express embodiments thereof, it is understood that many obvious modifications will be suggested to those skilled in the art without departing from the spirit and the scope of the invention.

Circuit constants of an actual embodiment of the invention based on the diagram of Fig. 3 and used in connection with a radio transmitter of the type shown in Fig. 8 of U. S. Patent 2,143,386, issued January 10, 1939, to W. Van B. Roberts are as follows:

| Component | Reference Numeral | Value |
|---|---|---|
| Capacitor | 19 | 25 mfd., 25 W. V. |
| Do | 46 | 22 mmfd. |
| Do | 55 | 0.01 mfd. |
| Do | 63 | 0.22 mfd. |
| Do | 65 | 0.01 mfd. |
| Resistor | 25 | 5600 ohm. |
| Do | 48 | 1 megohm. |
| Do | 52 | 270 ohm. |
| Do | 61 | 1.8 megohm. |
| Do | 62 | 120 kilohm. |
| Do | 64 | 1 megohm. |
| Potentiometer | 45 | 100 kilohm. |
| Transformer | 43 | 1:30 turns ratio. |
| Battery | 20 | 200 volts. |
| Potential | 58 | |
| Triode | 21 | RMA Type 6 BH6 with screen, suppresser grid and anode electrodes connected together. |
| Do | 50 | Triode section of RMA type 6AQ6. |
| Diode | 60 | Diode sections of RMA type 6AQ6 connected together. |

I claim as my invention:

1. An electronic circuit arrangement for limiting the electric output amplitude level of an acoustical-electrical conversion device over a wide range of acoustic input intensities, comprising said acoustical-electrical conversion device, an electron discharge device defining a space charge path and a source of direct potential connected in series thereby to produce a space charge current flowing in said circuit, means to produce a control potential proportional to the amplitude of said input intensities, and means to apply said control potential to said electron discharge device in such direction as to vary the intensity of said space discharge current in inverse proportion to the amplitude of said input intensities and maintain the electric output amplitude level of said conversion device substantially constant over the range of input intensities.

2. An electronic circuit arrangement for maintaining a substantially constant electric output amplitude level from an acoustical-electrical conversion device in response to a varying acoustic input level, comprising said acoustical-electrical conversion device, an electron discharge device defining a space charge path and a source of direct potential connected in series, means to produce a direct control potential proportional to the amplitude of said input level, and means to apply said control potential to said electron discharge device in direct proportion to the amplitude of said input level and in such direction as to vary the resistance of said space discharge path in direct proportion to the amplitude of said input intensities and maintain the electric output amplitude level of said conversion device substantially constant.

3. An electronic circuit arrangement for maintaining the electric output level of a microphone substantially constant in response to a varying acoustic input energy level, comprising said microphone, an electron discharge tube having cathode, control and anode electrodes, a microphone transformer and a source of direct potential connected in series, means to produce a direct control potential proportional to the amplitude of said acoustic level, and means to apply said direct control potential to the control electrode of said electron discharge device in direct proportion to the amplitude of said acoustic level and in such polarity as to vary the resistance of said series circuit in proportion to the amplitude of said acoustic level and maintain the electric output amplitude level of said microphone substantially constant over a range of acoustic input levels.

4. An electronic circuit arrangement including a source of input signals having an internal resistance component, a load impedance device, and a variable resistance device all connected in series circuit relationship, means to apply a fixed potential across said series connected circuit, means to derive a control potential proportional to the amplitude of said input signals, and means to apply said control potential to said variable resistance device in direct proportion to said input signal, thereby to vary the resistance in said series connected circuit in direct proportion to the amplitude of said input signal.

5. An electronic circuit arrangement for maintaining a substantially constant electrical output level from a microphone having a varying level of acoustical energy applied thereto, comprising said microphone, an electric device having first, second and third electrodes spaced apart from each other, said second electrode being a control electrode, means to couple the electric circuit of said microphone and the circuit path between said first and said third electrodes of said electric device in series with a source of direct potential, a rectifier device, means coupling the electric circuit of said conversion device to the input circuit of said rectifier device, and means to couple the output of said rectifier device to said second electrode of said electric device to bias said second electrode with respect to said first electrode.

6. An electronic circuit arrangement for maintaining a substantially constant electric level from carbon-button microphone having a varying level of acoustic energy applied thereto, comprising said microphone, a microphone transformer having primary and secondary windings, an electric device having first, second and third electrodes spaced apart from each other, said second electrode being a control electrode, means to couple the electric circuit of said microphone, the primary winding of said transformer, and the circuit path between said first and said third electrodes of said electric device in series with a source of direct potential, a rectifier device, means coupling the secondary winding of said transformer to the input circuit of said rectifier device, and means to couple the output of said rectifier device to said second electrode of said electric device to bias said control electrode with respect to said first electrode.

7. An electronic circuit arrangement comprising a carbon-button microphone, a microphone transformer, an electron discharge device having cathode, control and anode electrodes, and means to apply a direct potential in series circuit with said carbon-button microphone, the input winding of said microphone transformer and the cathode-anode electrode circuit of said electron discharge device, a rectifier element, means coupling the output winding of said microphone transformer to said rectifier element, and means coupling said rectifier element between a point of reference potential of said series circuit and the control electrode of said electron discharge device.

8. An electronic circuit arrangement comprising a double button carbon type microphone, first and second microphone transformers each having primary and secondary windings, an electron discharge device having cathode, control and anode electrodes, means to apply a direct potential in series circuit with one button of said microphone, the primary winding of said first microphone transformer and the cathode-anode electrode circuit of said electron discharge device, means to apply a direct potential in series circuit with the other button of said microphone and the primary winding of said second microphone transformer, a rectifier element, means to couple said rectifier element to the secondary winding of said second microphone transformer, and means coupling said rectifier element between a point of reference potential of said series circuits and the control electrode of said electron discharge device.

9. An electronic circuit arrangement comprising a carbon-button microphone, a microphone transformer, an electron discharge device having cathode, control and anode electrodes, and means to apply a direct potential in series circuit with said carbon-button microphone, the input winding of said microphone transformer and the cathode-anode electrode circuit of said electron discharge device, an amplifier stage, means coupling the output winding of said microphone transformer to the input of said amplifier stage, a rectifier element, and means coupling said rectifier element between the output of said amplifier stage and the control electrode of said electron discharge device.

10. An electronic circuit arrangement comprising a carbon-button microphone, a microphone transformer, a first electron discharge device having cathode, control and anode electrodes, and means to apply a direct potential in series circuit with said carbon-button microphone, the input winding of said microphone transformer and the cathode-anode electrode circuit of said first electron discharge device, a second electron discharge device having a cathode, a grid and an anode, means coupling the output winding of said microphone transformer between the grid and cathode of said second discharge device, and means coupling the anode-cathode circuit of said second electron discharge device between a point of reference potential of said series circuit and the control electrode of said first electron discharge device.

11. An electronic circuit arrangement comprising a carbon-button microphone, a microphone transformer, an electron discharge device having cathode, control and anode electrodes, and means to apply a direct potential in series circuit with said carbon-button microphone, the input winding of said microphone transformer and the cathode-anode electrode circuit of said electron discharge device, a rectifier element, means coupling the output winding of said microphone transformer to said rectifier element, and means coupling said rectifier element between a point of reference potential of said series circuit and the control electrode of said electron discharge device, said means comprising a filter section.

12. An electronic circuit arrangement comprising a double button carbon type microphone, first and second microphone transformers each having primary and secondary windings, an electron discharge device having cathode, control and anode electrodes, means to apply a direct potential in series circuit with one button of said microphone, the primary winding of said first microphone transformer and the cathode-anode electrode circuit of said electron discharge device, means to apply a direct potential in series circuit with the other button of said microphone and the primary winding of said second microphone transformer, a rectifier element, means including an amplifier stage to couple said rectifier element to the secondary winding of said second microphone transformer, means including a filter section to couple said rectifier element between a point of reference potential of said series circuits and the control electrode of said electron discharge device, and means including the secondary winding of said first microphone transformer to obtain an output voltage having a substantially constant level.

13. An electronic circuit arrangement comprising a carbon-button microphone, a microphone transformer, an electron discharge device having cathode, control and anode electrodes, and means to apply a direct potential in series circuit with said carbon-button microphone, the input winding of said microphone transformer and the cathode-anode electrode circuit of said electron discharge device, an amplifier stage, means coupling the output winding of said microphone transformer to the input of said amplifier stage, a rectifier element, and a filter section coupling said rectifier element between the output of said amplifier stage and the control electrode of said electron discharge device, said filter section preventing substantially any alternating component from appearing on said control electrode.

14. An electronic circuit arrangement comprising a carbon-button microphone, a microphone transformer having primary and secondary windings, a first electron discharge device having cathode, control and anode electrodes, and means to connect one terminal of said carbon-button microphone, the input winding of said microphone transformer the cathode electrode of said first electron discharge device, means to apply a direct potential between the remaining terminal of said carbon-button microphone and the anode electrode of said first electron device, a capacitor shunting said first electron discharge device, a second electron discharge device having a cathode, a grid and an anode, means coupling the output winding of said microphone transformer between the grid and cathode of said second discharge device, and means coupling the anode-cathode circuit of said second electron discharge device between said other terminal of said carbon-button microphone and the control electrode of said first electron discharge device.

15. An electronic circuit arrangement comprising a carbon-button microphone, a microphone load device, an electron discharge device having cathode, control and anode electrodes, and means to apply a direct potential in series circuit with said carbon-button microphone, said microphone load device and the cathode-anode electrode circuit of said electron discharge device, a rectifier element, means to couple the output of said microphone load device to said rectifier element to produce a direct control potential having an amplitude varying in proportion to the output level of said microphone, and a filter section coupling said rectifier element between a point of reference potential of said series circuit and the control electrode of said electron discharge device to apply said direct control potential to said control electrode to maintain said output level substantially constant.

16. An electronic circuit arrangement comprising a carbon-button microphone, a microphone transformer, an electron discharge device having cathode, control and anode of electrodes, and means to apply a direct potential in series circuit with said carbon-button microphone, the input winding of said microphone transformer and the cathode-anode electrode circuit of said electron discharge device, an amplifier stage, frequency responsive means coupling the output winding of said microphone transformer to the input of said amplifier stage to attenuate the higher frequencies to a different extent than the lower frequencies, a rectifier element, and means coupling said rectifier element between the output of said amplifier stage and the control electrode of said electron discharge device.

17. An electronic circuit arrangement comprising a carbon-button microphone, a microphone transformer, an electron discharge device having cathode, control and anode electrodes, and means to apply a direct potential in series circuit with said carbon-button microphone, the input winding of said microphone transformer and the cathode-anode electrode circuit of said electron discharge device, an amplifier stage, a capacitor coupling the output winding of said microphone transformer to the input of said amplifier stage, a resistor shunted across the input of said amplifier stage, said capacitor and said resistor having values at which a pre-emphasis characteristic is provided to attenuate the higher frequencies to a greater extent than the lower frequencies, a rectifier element, and means coupling said rectifier element between the output of said amplifier stage and the control electrode of said electron discharge device.

18. An electronic circuit arrangement including a source of input signals having an internal resistance component, a load device having an input circuit and an output circuit, a variable resistance device, means to connect said input signal source, the input circuit of said load device and said variable resistance device in series circuit relationship, means to apply a fixed potential across said series connected circuit, means to derive a direct potential proportional to the amplitude of said input signals, and means to apply said control potential to said variable resistance device in direct proportion to said input signal, thereby to vary the resistance of said series circuit in direct proportion to the amplitude of said input signal and maintain the signal level in the output circuit of said load device substantially constant.

LAWRENCE CAMPBELL FULLER, Jr.

REFERENCES CITED

The following references are of record in the file of this patent:

UNITED STATES PATENTS

| Number | Name | Date |
| --- | --- | --- |
| 1,993,860 | Roberts | Mar. 12, 1935 |
| 2,285,794 | Barney | June 9, 1942 |
| 2,462,552 | Renner | Feb. 22, 1949 |
| 2,468,139 | Theroux | Apr. 26, 1949 |